(12) United States Patent
Sato (10) Patent No.: US 11,220,185 B2
(45) Date of Patent: Jan. 11, 2022

(54) BATTERY MONITORING DEVICE AND ELECTRIC-VEHICLE CONTROL APPARATUS

(71) Applicant: SUBARU CORPORATION, Tokyo (JP)

(72) Inventor: Yutaka Sato, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 141 days.

(21) Appl. No.: 16/838,072

(22) Filed: Apr. 2, 2020

(65) Prior Publication Data

US 2020/0353821 A1 Nov. 12, 2020

(30) Foreign Application Priority Data

May 10, 2019 (JP) .............................. JP2019-089515

(51) Int. Cl.
*H02J 7/00* (2006.01)
*B60L 15/20* (2006.01)
(Continued)

(52) U.S. Cl.
CPC .............. *B60L 15/20* (2013.01); *B60L 58/24* (2019.02); *B60Q 9/00* (2013.01); *G01K 7/22* (2013.01); *G01K 13/00* (2013.01); *G01R 31/382* (2019.01); *H01M 10/425* (2013.01); *H01M 10/486* (2013.01); *H02J 7/0047* (2013.01); *H01M 2010/4271* (2013.01); *H01M 2010/4278* (2013.01); *H01M 2220/20* (2013.01)

(58) Field of Classification Search
USPC ................ 320/108, 109, 110, 134, 135, 136
See application file for complete search history.

(56) References Cited

U.S. PATENT DOCUMENTS

| | | | |
|---|---|---|---|
| 2006/0159141 A1* | 7/2006 | Uchida | ............... H01S 5/02415 372/34 |
| 2016/0059719 A1* | 3/2016 | Jung | ......................... B60L 3/00 320/109 |
| 2018/0076613 A1* | 3/2018 | Kume | .................... H02H 5/041 |

FOREIGN PATENT DOCUMENTS

AU  2006203523 A1 * 3/2008
CN  101055459 B  *  4/2011  ......... G03G 15/2039
(Continued)

*Primary Examiner* — Brian Ngo
(74) *Attorney, Agent, or Firm* — McDermott Will & Emery LLP (57) ABSTRACT

A battery monitoring device includes temperature detectors that detect respective temperatures of battery elements in a battery of an electric vehicle. The temperature detectors each include first and second detection circuits, a comparator circuit, and first and second output terminals. The first detection circuit detects a temperature in a first temperature range and generates a first detection signal. The second detection circuit detects a temperature in a second temperature range and generates a second detection signal. The comparator circuit compares a detection output signal with a threshold and generates a flag signal indicative of the presence or absence of an abnormal event. The detection output signal and the flag signal are outputted through a first output terminal and a second output terminal, respectively. Each of the temperature detectors switches the detection output signal between the first detection signal and the second detection signal on the basis of the flag signal.

15 Claims, 3 Drawing Sheets

(51) Int. Cl.
   *G01R 31/382*   (2019.01)
   *G01K 7/22*     (2006.01)
   *G01K 13/00*    (2021.01)
   *B60Q 9/00*     (2006.01)
   *H01M 10/48*    (2006.01)
   *H01M 10/42*    (2006.01)
   *B60L 58/24*    (2019.01)

(56) References Cited

FOREIGN PATENT DOCUMENTS

| | | | | |
|---|---|---|---|---|
| CN | 204915554 U | * | 12/2015 | ........... G01R 15/202 |
| JP | 4664753 B2 | * | 4/2011 | |
| JP | 4810991 B2 | * | 11/2011 | |
| JP | 4845512 B2 | * | 12/2011 | |
| JP | 2018-027713 A | | 2/2018 | |
| JP | 2020053775 A | * | 4/2020 | |

\* cited by examiner

BATTERY MONITORING DEVICE AND ELECTRIC-VEHICLE CONTROL APPARATUS

CROSS-REFERENCE TO RELATED APPLICATIONS

The present application claims priority from Japanese Patent Application No. 2019-089515 filed on May 10, 2019, the entire contents of which are hereby incorporated by reference.

BACKGROUND

The technology relates to a battery monitoring device that monitors a battery state of an electric vehicle and to an electric-vehicle control apparatus.

An electric vehicle often monitors a state of a battery that stores electric power for traveling. For example, Japanese Unexamined Patent Application Publication No. 2018-027713 discloses a vehicle system provided with temperature sensors that detect respective temperatures of different battery stacks in the battery.

SUMMARY

An aspect of the technology provides a battery monitoring device including temperature detectors configured to detect respective temperatures of battery elements in a battery of an electric vehicle. The temperature detectors each include a first detection circuit, a second detection circuit, a comparator circuit, a first output terminal, and a second output terminal. The first detection circuit is configured to detect a temperature in a first temperature range and generate a first detection signal. The second detection circuit is configured to detect a temperature in a second temperature range different from the first temperature range and generate a second detection signal. The comparator circuit is configured to compare a detection output signal with an abnormality threshold and generate a flag signal indicative of the presence or absence of an abnormal event. The detection output signal is the first detection signal or the second detection signal. The detection output signal is outputted through the first output terminal, and the flag signal is outputted through the second output terminal. Each of the temperature detectors is configured to switch the detection output signal between the first detection signal and the second detection signal on the basis of the flag signal.

An aspect of the technology provides an electric-vehicle control apparatus that includes the battery monitoring device according to one aspect of the technology and a vehicle controller. The vehicle controller is configured to control the electric vehicle on the basis of an output from the battery monitoring device. When the battery manager determines that the abnormal event corresponds to the abnormality of the corresponding one of the temperature detectors, the vehicle controller gives an occupant a warning about the abnormality. When the battery manager determines that the abnormal event corresponds to the overheating of the battery, the vehicle controller gives the occupant a warning about the overheating.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Some embodiments of the technology will now be described in detail with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments that are not recited in a most-generic independent claim of the technology are optional and may be provided on an as-needed basis. The drawings are schematic and are not intended to be drawn to scale. Throughout the present specification and the drawings, elements having substantially the same function and configuration are denoted with the same numerals to avoid any redundant description.

A battery that stores electric power for traveling generally includes multiple battery cells coupled in series. For highly reliable monitoring of a state of the battery, there is necessity to provide temperature sensors to the respective battery cells and detect states of the battery cells with the respective temperature sensors.

It however is difficult for a single temperature sensor to cover a large detection range from low temperature to high overheating temperature. The detection range of the single temperature sensor is thus set within an ordinary temperature range. This rises a concern that when the temperature sensor outputs a signal indicative of the presence of an abnormal event, for example, it is difficult to determine whether the abnormal event corresponds to overheating of the corresponding battery cell or an abnormality of the temperature sensor.

One possible solution to this concern could be to provide a plurality of temperature sensors having different detection ranges to each of the battery cells. In this case, however, it is necessary to prepare an increased number of temperature sensors which is equal to the number of battery cells in the battery multiplied by the number of temperature sensors for each of the battery cells. This forces a battery monitoring device to process a large number of signals indicative of a state of the battery (hereinafter also referred to as battery-state signals).

It is desirable to provide a battery monitoring device that achieves highly reliable monitoring of a battery state and suppresses an increase in the number of battery-state signals, and an electric-vehicle control apparatus that appropriately controls an electric vehicle on the basis of the result of the monitoring by the battery monitoring device.

Figure 1:
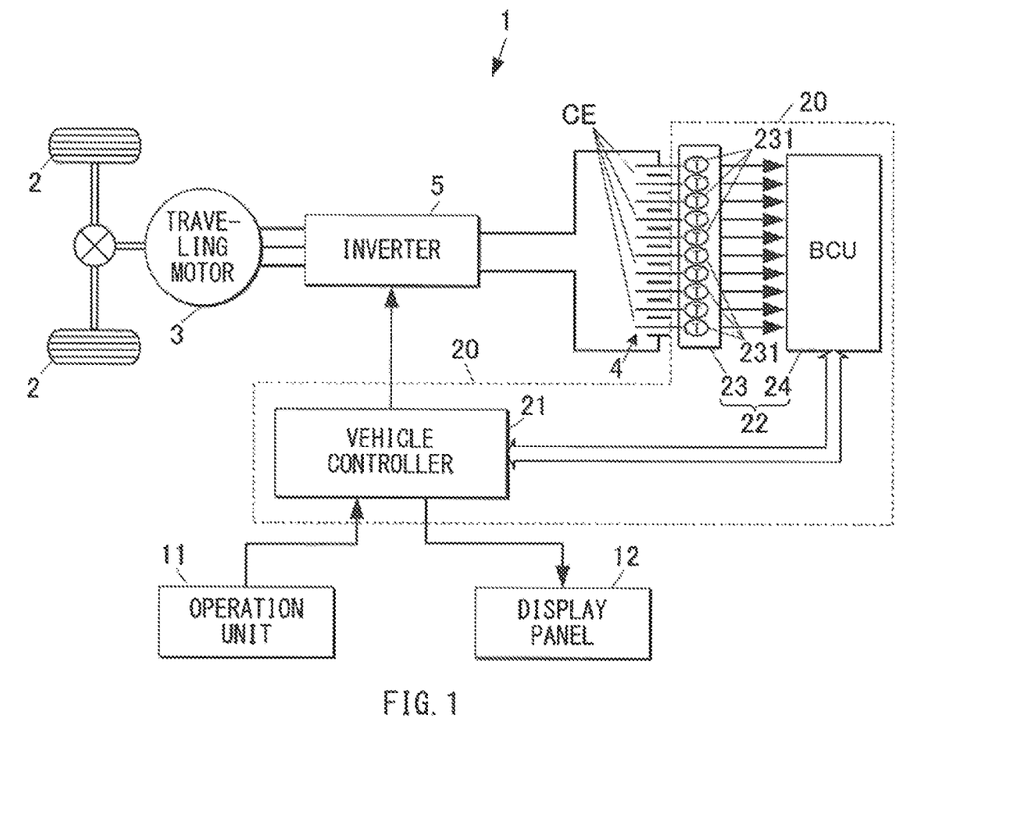
FIG. 1 is a block diagram illustrating an electric vehicle according to one example embodiment of the technology.

Some embodiments of the technology will now be described in detail with reference to the accompanying drawings. FIG. 1 is a block diagram illustrating an electric vehicle 1 according to an example embodiment of the technology.

The electric vehicle 1 according to the present embodiment may be an electric vehicle (EV) or a hybrid electric vehicle (HEV). The electric vehicle 1 may include drive wheels 2, a traveling motor 3, a battery 4, and an inverter 5. The traveling motor 3 may generate power to drive the drive wheels 2. The battery 4 may store electric power to drive the traveling motor 3. The inverter 5 may convert electric power received from the battery 4 to drive the traveling motor 3. The electric vehicle 1 may further include an operation unit 11, a display panel 12, and a control apparatus 20. The operation unit 11 may receive operational commands from an occupant of the electric vehicle 1. The display panel 12 may output information to the occupant. The control apparatus 20 may control the electric vehicle 1. The operation unit 11 may include a driving operation component, such as a steering wheel, a pedal, or a shift lever.

The control apparatus 20 includes a vehicle controller 21 and a battery monitoring device 22. The vehicle controller 21 controls the electric vehicle 1. The battery monitoring device 22 monitors a state of the battery 4. The battery monitoring device 22 may include a monitoring circuit 23 and a battery control unit (BCU) 24. The monitoring circuit 23 may detect a state of the battery 4. The BCU 24 may control the battery 4 on the basis of the result of detection by the monitoring circuit 23. In one embodiment, the BCU 24 may serve as a "battery manager". The vehicle controller 21 and the BCU 24 may each include a single electric control unit (ECU). Alternatively, the vehicle controller 21 and the BCU 24 may each include a plurality of ECUs that operate in cooperation with one another. Still alternatively, a single ECU may serve as the vehicle controller 21 and also as the BCU 24.

The battery 4 may be, for example, a lithium-ion secondary battery or a nickel-hydrogen secondary battery that includes a plurality of battery cells CE coupled in series. Alternatively, the battery 4 may include a plurality of battery units coupled in series or parallel, and each of the battery units may include a plurality of battery cells CE coupled in series.

The monitoring circuit 23 includes temperature detectors 231 that detect respective temperatures of the battery cells CE in the battery 4 and non-illustrated voltage detectors. Optionally, the monitoring circuit 23 may include a voltage sensor that detects an overall voltage of the battery 4 and a current sensor that detects an overall discharge current and an overall charging current of the battery 4. The monitoring circuit 23 may output the battery-state signals to the BCU 24. The battery-state signals may be indicative of the result of detection by the monitoring circuit 23. For example, the battery-state signals may include detection signals indicative of respective temperatures of the battery cells CE, detection signals indicative of respective voltages of the battery cells CE, and flag signals indicative of the presence or absence of an abnormal event in the respective battery cells CE.

Figure 2:
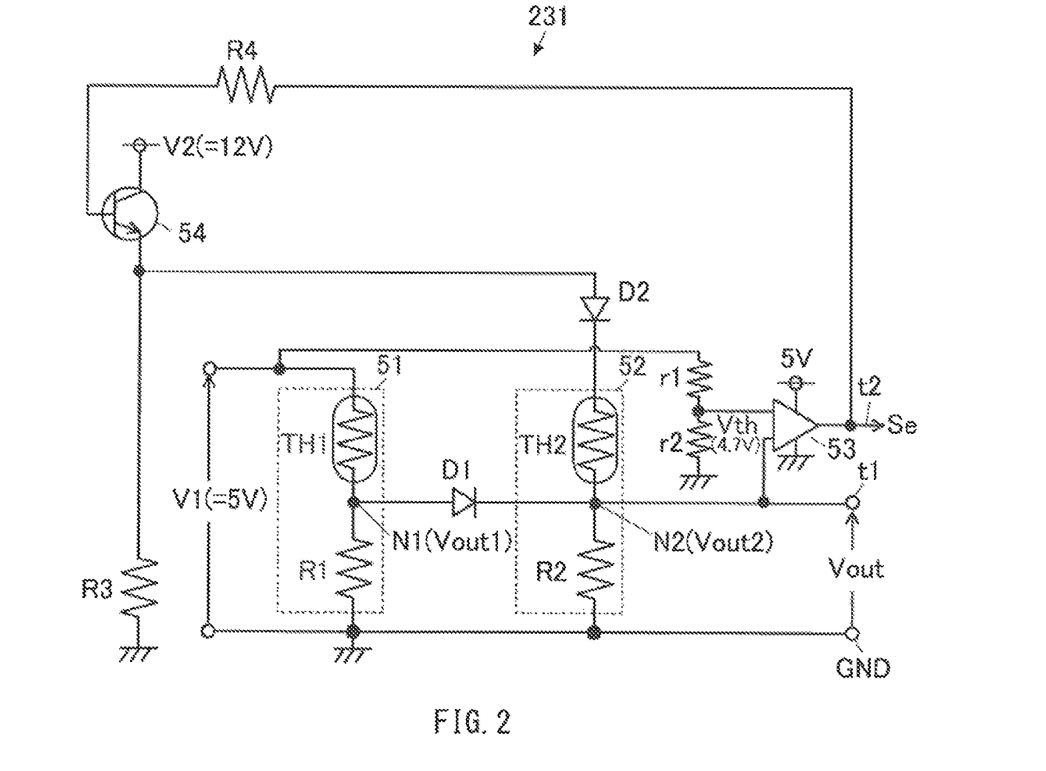
FIG. 2 is a circuit diagram of a temperature detector illustrated in FIG. 1.
Figure 3:
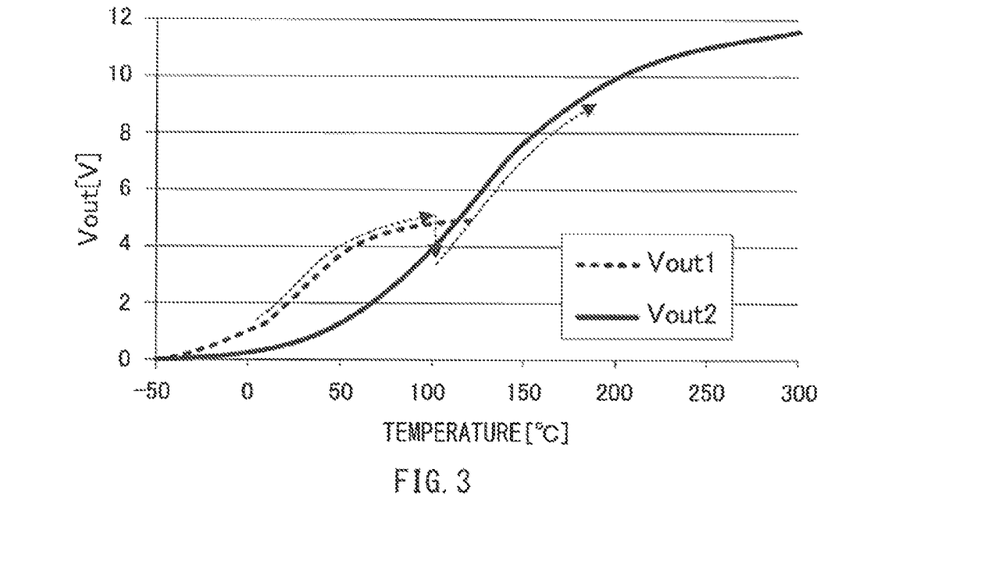
FIG. 3 is a graph illustrating an example relation of a first detection signal Vout1 of a first detection circuit and a second detection signal Vout2 of a second detection circuit to temperature.

FIG. 2 is a circuit diagram of each of the temperature detectors 231. FIG. 3 is a graph illustrating an exemplary relation of a first detection signal Vout1 of a first detection circuit 51 and a second detection signal Vout2 of a second detection circuit 52 to temperature.

The temperature detector 231 may include the first detection circuit 51, the second detection circuit 52, a comparator circuit 53, a power switch 54, a first diode D1, and a second diode D2. The first detection circuit 51 detects a temperature in a first temperature range and generates a first detection signal Vout1. The first temperature range corresponds to an ordinary temperature range. The second detection circuit 52 detects a temperature in a second temperature range different from the first temperature range and generates a second detection signal Vout2. The second temperature range corresponds to an overheating temperature range that may partially include the ordinary temperature range. The comparator circuit 53 determines abnormality of the detected temperature and generates a flag signal indicative of the presence or absence of an abnormal event. The power switch 54 may switch the second detection circuit 52 between being supplied with a second power voltage V2 (e.g., 12 volts) and not being supplied with the second power voltage V2. The first diode D1 and the second diode D2 may suppress interference between the first detection circuit 51 and the second detection circuit 52. The temperature detector 231 further includes a first output terminal t1, a second output terminal t2, and a grounding terminal GND. A detection output signal Vout (i.e., the first detection signal Vout1 or the second detection signal Vout2) indicative of the detected temperature is transmitted to the first output terminal t1. The flag signal Se indicative of the presence or absence of an abnormal event is transmitted to the second output terminal t2. The grounding terminal GND may be grounded. The flag signal Se may be, for example, a binary signal that indicates the presence of an abnormal event when at a high level and the absence of an abnormal event when at a low level.

The first detection circuit 51 may be a voltage-dividing circuit including a first thermistor TH1 and a first voltage-dividing resistor R1 that are coupled in series. The first detection circuit 51 may operate in response to application of a first power voltage V1, which is a low voltage (e.g., 5 volts), across the first detection circuit 51, to output the first detection signal Vout1 indicative of the detected temperature from an output node N1. The first detection signal Vout1 may be a voltage obtained by dividing the first power voltage V1. The first thermistor TH1 may have characteristics conformable to the ordinary temperature range (e.g., $-30°$ C. to $80°$ C.). In other words, the first thermistor TH1 may change its resistance more greatly in the ordinary temperature range than in other temperature ranges. The first thermistor TH1 may be disposed on a portion of the corresponding battery cell CE to which heat is transferred. As illustrated in FIG. 3, the first detection signal Vout1 may be a voltage signal that varies within the range of the first power voltage V1 depending on a temperature in the ordinary temperature range.

The second detection circuit 52 may be a voltage-dividing circuit including a second thermistor TH2 and a second voltage-dividing resistor R2 that are coupled in series. The second detection circuit 52 may operate in response to application of a second power voltage V2, which is a high voltage (e.g., 12 volts), across the voltage-dividing circuit to output the second detection signal Vout2 indicative of the detected temperature from an output node N2. The second detection signal Vout2 may be a voltage obtained by dividing the second power voltage V2. The second thermistor TH2 may have characteristics conformable to the overheating temperature range (e.g., $100°$ C. to $250°$ C.) that may partially include the ordinary temperature range. In other words, the second thermistor TH2 may change its resistance more greatly in the overheating temperature range than in other temperature ranges. The second thermistor TH2 may be disposed on a portion of the corresponding battery cell CE to which heat is transferred. As illustrated in FIG. 3, the second detection signal Vout2 may be a voltage signal that varies within the range of the second power voltage V2 depending on a temperature in the overheating temperature range.

The output node N1 of the first detection circuit 51 and the output node N2 of the second detection circuit 52 may be coupled via the first diode D1. The output node N2 of the second detection circuit 52 may be directly coupled to the first output terminal t1. The first diode D1 may be coupled in such a direction that an electric current flows from the output node N1 to the output node N2. While the second detection circuit 52 is in operation within the overheating temperature range, the first diode D1 may cut off the first detection circuit 51 from the first output terminal t1.

The second detection circuit 52 may be coupled to the power switch 54 via the second diode D2. The second diode D2 may be coupled in such a direction that an electric current flows from the power switch 54 to the second detection circuit 52. While the second detection circuit 52 is not in operation, the second diode D2 may prevent an electric current from flowing from the first detection circuit 51 to the second thermistor TH2 of the second detection circuit 52.

For simplicity, workings of the first diode D1 and the second diode D2 of lowering a voltage are not taken into consideration in the present embodiment. To operate the temperature detector 231 as in an embodiment in which the workings of the first diode D1 and the second diode D2 of lowering a voltage are taken into consideration, a threshold voltage for the comparator circuit 53 and characteristic values of the first thermistor TH1 and the second thermistor TH2 may be adjusted as appropriate in the present embodiment.

The comparator circuit 53 may be a comparator that compares the detection output signal Vout (i.e., the first detection signal Vout1 of the first detection circuit 51 or the second detection signal Vout2 of the second detection circuit 52) to be transmitted to the first output terminal t1 with an abnormality threshold voltage Vth (e.g., 4.7 volts). The comparator circuit 53 may then output the flag signal Se indicative of the result of the comparison to the second output terminal t2. As described above, the flag signal Se may be, for example, a binary signal that indicates the presence of an abnormal event when at a high level, and the absence of an abnormal event when at a low level.

When the flag signal Se indicative of the presence of an abnormal event is outputted through the second output terminal t2 to a control terminal of the power switch 54, the power switch 54 may supply the second power voltage V2 to the second detection circuit 52. When the flag signal Se indicative of the absence of an abnormal event is outputted through the second power voltage V2 to the control terminal of the power switch 54, the power switch 54 may stop supplying the second power voltage V2 to the second detection circuit 52.

Example Operations of Temperature Detector

The temperature detector 231 may output the detection output signal Vout indicative of the temperature of the corresponding battery cell CE through the first output terminal t1, and the flag signal Se indicative of the presence or absence of an abnormal event through the second output terminal t2.

When the battery cell CE has a temperature in the ordinary temperature range (e.g., within a range from −30° C. to 80° C.), the first detection signal Vout1 based on the temperature of the battery cell CE may be outputted from the first detection circuit 51 through the output node N1 to the first output terminal t1, and the flag signal Se indicative of the absence of an abnormal event may be outputted from the comparator circuit 53 to the second output terminal t2. In response to the flag signal Se indicative of the absence of an abnormal event, the power switch 54 may be turned off to switch the second detection circuit 52 to non-operational mode. In this case, the second diode D2 prevents an electric current from partly flowing from the first detection circuit 51 into the second thermistor. This allows the first detection signal Vout1 of the first detection circuit 51 to be outputted through the first output terminal t1 without interference with the second detection circuit 52.

When the battery cell CE reaches a temperature in the overheating temperature range (e.g., 100° C. to 250° C.), the first detection signal Vout1 increased in voltage may be outputted from the first detection circuit 51, and the flag signal Se indicative of the presence of an abnormal event may be outputted from the comparator circuit 53. In response to the flag signal indicative of the presence of an abnormal event, the power switch 54 may be turned on to switch the second detection circuit 52 to operational mode, and the second detection circuit 52 may output the second detection signal Vout2 based on the temperature of the corresponding battery cell CE. When the battery cell CE is in the overheating temperature range, the first detection signal Vout1 of the first detection circuit 51 may be saturated, and the second detection signal Vout2 of the second detection circuit 52 may become greater than the first detection signal Vout1. The first diode D1 may thus cut off the output node N1 of the first detection circuit 51 from the first output terminal t1. This allows the second detection signal Vout2 of the second detection circuit 52 to be outputted through the first output terminal t1 without interference with the first detection circuit 51. The BCU 24 may detect that the detection output signal Vout outputted through the first output terminal t1 is switched from the first detection signal Vout1 of the first detection circuit 51 to the second detection signal Vout2 of the second detection circuit 52 on the basis of the flag signal Se outputted through the second output terminal t2.

When an abnormality, such as a short circuit of the first thermistor TH1, occurs in the first detection circuit 51 while the battery cell CE is in the ordinary temperature range, the first detection signal Vout1 increased in voltage may be outputted from the first detection circuit 51, and the flag signal Se indicative of the presence of an abnormal event may be outputted from the comparator circuit 53. In response to the flag signal indicative of the presence of an abnormal event, the power switch 54 may be turned on to switch the second detection circuit 52 to the operational mode, and the second detection circuit 52 may output the second detection signal Vout2 based on the the temperature of the corresponding battery cell CE. When the battery cell CE is in the ordinary temperature range, the second detection signal Vout2 of the second detection circuit 52 may be substantially equal to or less than the first detection signal Vout1 of the first detection circuit 51 in which the abnormality has occurred. This may allow the first detection signal Vout1 of the first detection circuit 51 in which the short circuit has occurred to be continuously outputted through the first output terminal t1. The BCU 24 may detect the presence of an abnormal event on the basis of the flag signal Se outputted through the second output terminal t2, and that the abnormal event corresponds to an abnormality of the temperature detector 231 on the basis of the fact that the detection output signal Vout outputted through the first output terminal t1 does not vary among values indicative of high temperatures within the ordinary temperature range.

[Control Process]

Figure 4:
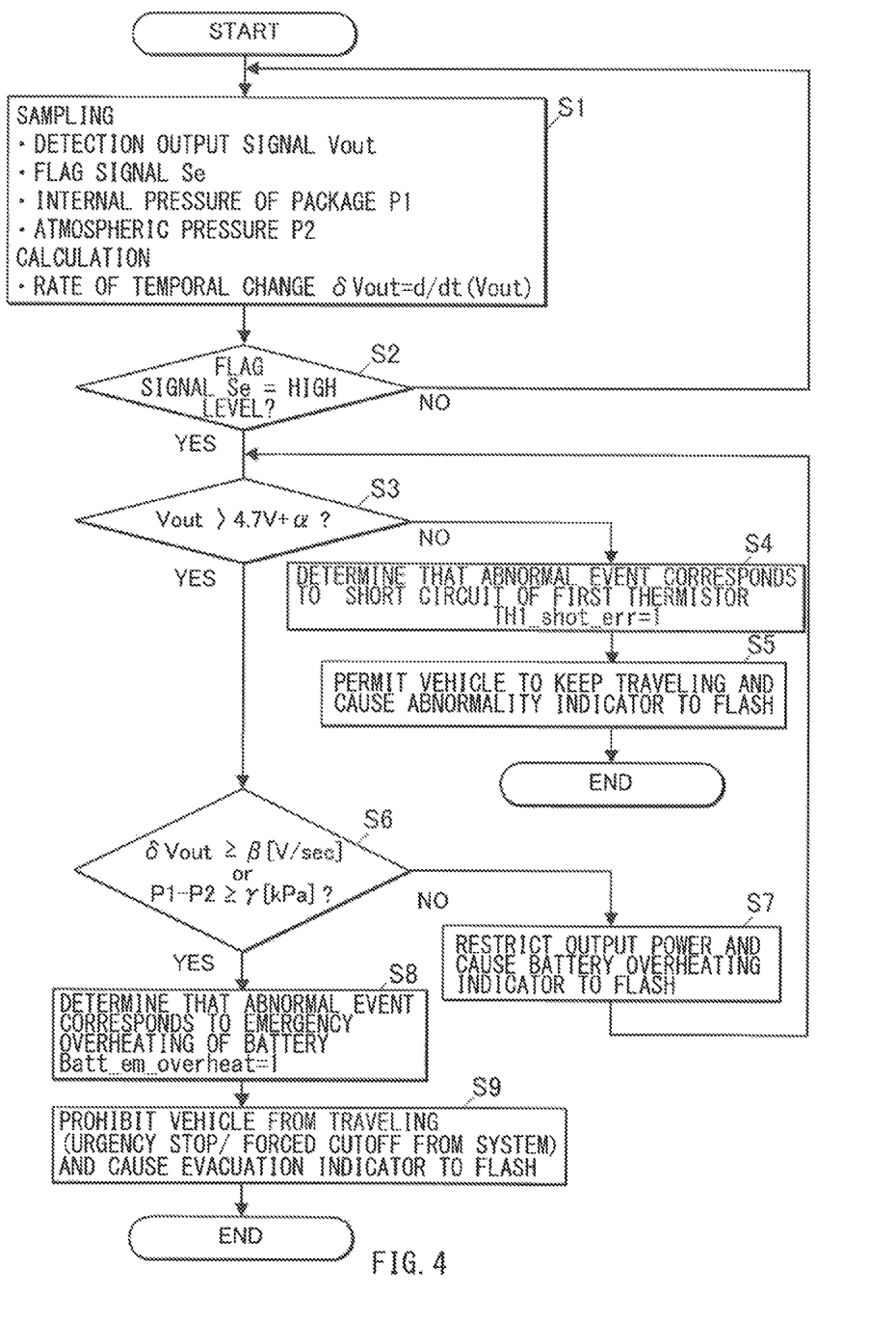
FIG. 4 is a flowchart illustrating an exemplary abnormal-event detection process executed by a battery control unit and a vehicle controller illustrated in FIG. 1.

FIG. 4 is a flowchart illustrating an example of an abnormal-event detection process executed by the BCU 24 and the vehicle controller 21. The process of detecting an abnormal event in the battery 4 executed by the BCU 24 and the vehicle controller 21 will now be described with reference to FIG. 4. In the following example, the abnormal-event detection process may be implemented through cooperation between the BCU 24 and the vehicle controller 21 via data communication. In another example, however, the abnormal-event detection process may be implemented solely by the BCU 24 or the vehicle controller 21.

The abnormal-event detection process may start upon activation of the electric vehicle 1. After the start of the abnormal-event detection process, the BCU 24 may first sample the battery-state signals received from the monitoring circuit 23 to calculate necessary data (Step S1). The battery-state signals received from the monitoring circuit 23 may include signals outputted from the temperature detectors 231 including the detection output signal Vout and the flag signal Se. Optionally, the battery-state signal received from the monitoring circuit 23 may include data on an internal pressure P1 of a package in which the battery 4 is hermetically sealed and data on an atmospheric pressure (an external pressure outside the package) P2. The necessary data to be calculated may include a rate of temporal change Vout of the detection output signal Vout. The rate of temporal change Vout may be calculated on the basis of a previous detection output signal Vout, a current detection output signal Vout, and a sampling interval.

Thereafter, the BCU 24 may determine whether a high-level signal indicative of the presence of an abnormal event is included in the flag signals Se received from the temperature detectors 231 (Step S2). If the high-level signal is not included (Step S2: NO), the BCU 24 may determine that the battery 4 has a temperature in the ordinary temperature range, and the procedure may return to Step S1. As long as the high-level signal is not detected, Steps S1 and S2 may be repeated in a loop.

If the high-level signal is included (Step S2: YES), the BCU 24 may determine whether the detection output signal Vout received from the temperature detector 231 in which the presence of an abnormal event is detected has a voltage greater than a sum voltage (Vth+α) obtained by adding an error a to the threshold voltage Vth (Step S3). If the detection output signal Vout has a voltage not greater than the sum voltage (Vth+α) (Step S3: NO), the BCU 24 may determine that the abnormal event corresponds to an abnormality of the temperature detector 231 (e.g., a short circuit of the first thermistor TH1 of the first detection circuit 51), and assign a determination value "1" to a control variable "TH1_short_err" (Step S4). Thereafter, the resultant value of the control variable "TH1_short_err" may be transmitted to the vehicle controller 21. On the basis of the resultant value of the control variable "TH1_short_err", the vehicle controller 21 may permit the electric vehicle 1 to keep traveling and cause an abnormality indicator of the display panel 12 to flash (Step S5). The abnormal-event detection process may then end. The resultant value of the variable "TH1_short_err" may be retained after halting and rebooting of the system of the electric vehicle 1.

In contrast, if the detection output signal Vout has a voltage greater than the sum voltage (Vth+a) (Step S3: YES), the BCU 24 may determine whether the rate of temporal change $\delta$Vout [V/sec] of the detection output signal Vout is equal to or greater than a threshold β [V/sec] that indicates the possibility of emergency overheating (i.e., $\delta$Vout≥β [V/sec]: first inequality) (Step S6). In Step S6, the BCU 24 may also determine whether a difference (P1−P2) between the internal pressure P1 of the package of the battery 4 and the atmospheric pressure is equal to or greater than a threshold γ that indicates the possibility of emergency overheating (i.e., P1−P2≥γ [kPa]: second inequality). The term "emergency overheating" as used herein refers to abnormal heating at which the use of the battery 4 should be prohibited. The term "overheating" as used herein refers to abnormal heating lower than the emergency overheating and at which a continuous use of the battery 4 may be permissible with restriction of a discharge current from the battery 4.

In a case where the rate of temporal change $\delta$Vout has a non-linear characteristic, the rate of temporal change $\delta$Vout may be multiplied by a coefficient which depends on a value of the rate of temporal change $\delta$Vout to calculate the rate of temporal change of a temperature. In this case, the resultant value of the rate of temporal change $\delta$Vout multiplied by the coefficient may be compared with the threshold β in the abnormal-event determination process in Step S6. In another case where the threshold β varies depending on temperature, the variation of the threshold β may be taken into consideration in the abnormal-event determination process in Step S6.

If both of the first and second inequalities do not hold (Step S6: NO), the BCU 24 may determine that the abnormal event corresponds to temporal overheating of the battery 4. The BCU 24 may thus lower the value of control data on a dischargeable electric power of the battery 4, and send data on the temporal overheating to the vehicle controller 21 (Step S7). When receiving the data on the temporal overheating, the vehicle controller 21 may cause a battery overheating indicator of the display panel 12 to flash. Additionally, when causing the inverter 5 to transmit electric power from the battery to the traveling motor 3 in response to an occupant's driving operation, the vehicle controller 21 may cause the inverter 5 to operate within the restricted dischargeable electric power range determined by the BCU 24. Traveling power of the electric vehicle 1 may be thereby restricted. After Step S7, the BCU 24 may cause the procedure to return to Step S3.

If at least one of the first and second inequalities holds (Step S6: YES), the BCU 24 may determine that the abnormal event corresponds to emergency overheating of the battery 4 and assign a determination value "1" to a control variable "Batt_em_overheat" (Step S8). Thereafter, the resultant value of the variable "Batt_em_overheat" may be transmitted to the vehicle controller 21. On the basis of the resultant value of the control variable "Batt_em_overheat", the vehicle controller 21 may prohibit the electric vehicle 1 from traveling (Step S9). For example, the vehicle controller 21 may cause the electric vehicle 1 to make an urgency stop or may forcibly cut off the battery 4 from the system. Additionally, the vehicle controller 21 may cause an evacuation indicator of the display panel 12 to flash to urge the occupant to evacuate outside the electric vehicle 1 (Step S9). The abnormal-event detection process may then end. The resultant value of the variable "Batt_em_overheat" may be retained after halting and rebooting of the system of the electric vehicle 1.

Alternatively, the BCU 24 may verify any one of the first and second inequalities in the determination process in Step S6. Still alternatively, the BCU 24 may determine that the abnormal event corresponds to the emergency overheating of the battery 4 if both of the first and second inequalities hold in the determination process in Step S6, and determine that the abnormal event corresponds to the temporal overheating of the battery 4 if any one of the first and second inequalities does not hold in the determination process in Step S6.

According to the battery monitoring device 22 of at least one of the embodiments described above, each of the temperature detectors 231 includes the first detection circuit 51 that detects a temperature in the first temperature range, the second detection circuit that detects a temperature in the second temperature range different from the first temperature range, and the comparator circuit 53 that outputs the flag signal. On the basis of signals received from these circuits, the battery monitoring device 22 makes it possible to distinguish the state of the battery cell CE being in the ordinary temperature range, the state of the battery cell CE being in the overheating temperature range, and the abnormal state of the temperature detector 231. The temperature detector 231 further includes the first output terminal t1 through which the detection output signal Vout indicative of the detected temperature is outputted, and the second output terminal t2 through which the flag signal Se indicative of the presence or absence of an abnormal event is outputted. When the flag signal Se outputted through the second output terminal t2 is switched from being indicative of the absence of an abnormal event to being indicative of the presence of an abnormal event, the detection output signal Vout to be outputted through the first output terminal t1 may be switched accordingly from the first detection signal Vout1 of the first detection circuit 51 to the second detection signal Vout2 of the second detection circuit 52. This reduces the number of signals outputted from each of the temperature detectors 231 even in a case where the multiple temperature detectors 231 are provided for the respective battery cells CE. It therefore is possible to prevent an increase in the total number of the signals indicative of the state of the battery 4.

According to the battery monitoring device 22 of at least one of the embodiments described above, the first detection circuit 51 may be a voltage-dividing circuit that operates in response to the application of the first power voltage V1, and the second detection circuit 52 may be a voltage-dividing circuit that operates in response to the application of the second power voltage V2 different in voltage from the first power voltage V1. Such a configuration allows the difference between the first detection signal Vout1 of the first detection circuit 51 and the second detection signal Vout2 of the second detection circuit 52 to be relatively small in the ordinary temperature range, whereas allowing the second detection signal Vout2 of the second detection circuit 52 to be greater than the first detection signal Vout1 of the first detection circuit 51 in the overheating temperature range. With such setting, a variation width of the detection output signal Vout outputted through the first output terminal t1 may be smaller between before and after the switching from the first detection signal Vout1 of the first detection circuit 51 to the second detection signal Vout2 of the second detection circuit 52 due to overheating of the battery cell CE. This ensures the characteristics of the detection output signal Vout that varies in a substantially continuous manner depending on temperature. It therefore is possible for the BCU 24 to easily control the detection output signal Vout.

According to the battery monitoring device 22 of at least one of the embodiments described above, the second power voltage V2 may be supplied to the second detection circuit 52 in response to the flag signal Se indicative of the presence of an abnormal event. This switches the detection output signal Vout to be outputted through the first output terminal t1. When the battery cell CE has a temperature in the ordinary temperature range and no abnormal event is generated in the temperature detector 231, the second detection circuit 52 may be switched to the non-operational mode, which reduces electric consumption. In contrast, when the battery cell CE has a temperature in the overheating temperature range, the second detection circuit 52 may be switched to the operational mode to output the second detection signal Vout2 greater in voltage than the first detection signal Vout1 of the first detection circuit 51. The detection output signal Vout to be outputted through the first output terminal t1 may thus be switched to the second detection signal Vout2 of the second detection circuit 52 by a passive signal switch, such as the first diode D1. It therefore is possible to easily control the switching of the detection output signal Vout to be outputted through the first output terminal t1.

According to the battery monitoring device 22 of at least one of the embodiments described above, the first diode D1 may be disposed between the output node N1 of the first detection circuit 51 and the output node N2 of the second detection circuit 52. When the second detection circuit 52 is supplied with the second power voltage V2 and outputs the second detection signal Vout2 greater than the first detection signal Vout1 of the first detection circuit 51, the first diode D1 may guide the second detection signal Vout2 of the second detection circuit 52 to the first output terminal t1 while avoiding interference between the first detection circuit 51 and the second detection circuit 52.

According to the battery monitoring device 22 of at least one of the embodiments described above, the second diode D2 may be disposed between the second detection circuit 52 and the power switch 54. When the second detection circuit 52 is not supplied with the second power voltage V2 and thus in the non-operational mode, the second diode D2 may guide the first detection signal Vout1 of the first detection circuit 51 to the first output terminal t1 while suppressing the interference between the first detection circuit 51 and the second detection circuit 52. For example, the second diode D2 may prevent an electric current from flowing from the first detection circuit 51 to the second thermistor TH2 of the second detection circuit 52. This suppresses the interference between the second detection circuit 52 and the first detection circuit 51.

According to the battery monitoring device 22 of at least one of the embodiments described above, when the flag signal Se indicative of the presence of an abnormal event is outputted through the second output terminal t2, the BCU 24 may determine whether the abnormal event corresponds to the overheating of the battery 4 or the abnormality of the temperature detector 231, on the basis of the detection output signal Vout outputted through the output terminal t1 (Step 3 in FIG. 4). If the temperature detector 231 is in a normal operation despite the fact that the flag signal Se indicative of the presence of an abnormal event is outputted, the detection output signal Vout to be outputted through the first output terminal t1 may be switched to the second detection signal Vout2 of the second detection circuit 52 that varies depending on temperature. In contrast, when the flag signal Se indicative of the presence of an abnormal event is outputted due to the abnormality of the temperature detector 231, the detection output signal Vout outputted through the first output terminal t1 may be kept at a voltage slightly lower than the first power voltage V1 (e.g., 5 volts). Accordingly, it is possible for the BCU 24 to achieve the above-described determination with high reliability on the basis of the detection output signal Vout.

According to the battery monitoring device 22 of at least one of the embodiments described above, when the flag signal Se indicative of the presence of an abnormal event is outputted through the second output terminal t2, the BCU 24 may determine whether the use of the battery 4 is permissible on the basis of the rate of temporal change δVout of the detection output signal Vout outputted through the first output terminal t1 (Step S6 in FIG. 4). In other words, the BCU 24 may determine, on the basis of the rate of temporal change δVout, that the battery cell CE is undergoing the temporal overheating and the use of the battery 4 is thus kept permissible with restriction of the output, or that the battery cell CE is undergoing the emergency overheating and the use of the battery 4 is thus prohibited. When the flag signal Se indicative of the presence of an abnormal event is outputted, the temperature detector 231 may output the detection output signal Vout (i.e., the second detection signal Vout2) of the second detection circuit 52. This allows the BCU 24 to detect a temperature of the battery cell CE with high resolution even if the temperature of the battery cell CE is in the overheating temperature range. Accordingly, it is possible for the BCU 24 to achieve the above-described determination with high reliability on the basis of the rate of temporal change Vout of the detection output signal Vout.

According to the control apparatus 20 for the electric vehicle 1 of at least one of the embodiments described above, when the BCU 24 detects overheating of the battery 4, the vehicle controller 21 gives the occupant a warning about the overheating. For example, the vehicle controller 21 may cause a battery overheating indicator or an evacuation indicator to flash to urge the occupant to evacuate outside the vehicle. Additionally, when the BCU 24 detects an abnormality of the temperature detector 231, the vehicle controller 21 may give the occupant a warning about the abnormality of the temperature detector 231. For example, the vehicle controller 21 may cause an abnormality indicator to flash. Such warning based on the highly reliable determination helps the occupant take appropriate measures depending on the type of the abnormal event.

Although some embodiments of the technology are described above, it should be appreciated that these embodiments are not limitative. For example, in the foregoing embodiment illustrated in FIG. 2, the detection output signal Vout to be outputted through the first output terminal t1 may be switched on the basis of the flag signal Se. In another embodiment of the technology, however, a semiconductor switch may be provided that selectively couples the first detection circuit or the second detection circuit to the first output terminal t1 on the basis of the flag signal Se. Additionally, in at least one of the embodiment described above, the first power voltage V1 applied to the first detection circuit 51 and the second power voltage V2 applied to the second detection circuit 52 may be different from each other. In another embodiment of the technology, however, the first power voltage V1 and the second power voltage V2 may be equal to each other. Further, in at least one of the embodiment described above, each of the battery cells may serve as a single battery element provided with the corresponding temperature detector. In another embodiment of the technology, however, each group of n number of battery cells may serve as a single battery element and may be provided with the corresponding temperature detector. Further, in at least one of the embodiments described above, the comparator circuit 53 may compare either one of the first detection signal Vout1 of the first detection circuit 51 and the second detection signal Vout2 of the second detection circuit 52, whichever is to be outputted to the first output terminal t1, with the threshold voltage Vth. In another embodiment of the technology, however, the comparator circuit may compare only the first detection signal Vout1 of the first detection circuit 51 with a predetermined threshold. In still another embodiment of the technology, the comparator circuit 53 may compare only the second detection signal Vout2 of the second detection circuit 52 with the predetermined threshold. In still another embodiment of the technology, the comparator circuit 53 may compare the detection output signal indicative of the temperature detected by means other than the first detection circuit and the second detection circuit with a predetermined threshold. The other details, such as specific circuit configurations of the first detection circuit and the second detection circuit, the procedure of controlling the electric vehicle 1 based on a signal from the temperature detector 231, according to the embodiments described above, may be appropriately modified without departing from the gist of the technology.

According to at least one of the embodiments described above, the battery monitoring device includes the battery elements provided with the respective temperature detectors each of which has the first detection circuit and the second detection circuit that have different temperature detection ranges. Such a configuration enables detection of a temperature of each battery element, overheating of each battery element, and an abnormality of the detection circuit of each battery element. This leads to highly reliable monitoring of the battery. Furthermore, according to at least one of the embodiments described above, the battery monitoring device may cause the comparator circuit to output the signal indicative of the presence of an abnormal event through the second output terminal. Additionally, the detection output signal to be outputted through the first output terminal may be switched from the first detection signal of the first detection circuit to the second detection signal of the second detection circuit on the basis of the flag signal outputted through the second output terminal. The detection signals indicative of respective temperatures detected at the temperature detectors are thereby combined into a single detection output signal to be outputted through the first output terminal. Accordingly, it is possible to suppress an increase in the number of the battery-state signals.

The invention claimed is:

1. A battery monitoring device comprising
temperature detectors configured to detect respective temperatures of battery elements in a battery of an electric vehicle, the temperature detectors each including:
a first detection circuit configured to detect a temperature in a first temperature range and generate a first detection signal;
a second detection circuit configured to detect a temperature in a second temperature range different from the first temperature range and generate a second detection signal;
a comparator circuit configured to compare a detection output signal with an abnormality threshold and generate a flag signal indicative of presence or absence of an abnormal event, the detection output signal comprising the first detection signal or the second detection signal;
a first output terminal through which the detection output signal is outputted; and
a second output terminal through which the flag signal is outputted, wherein each of the temperature detectors is configured to switch the detection output signal between the first detection signal and the second detection signal on a basis of the flag signal.

2. The battery monitoring device according to claim 1, wherein
the first detection circuit comprises a voltage-dividing circuit including a first thermistor and a first resistor that are coupled in series and is configured to operate in response to application of a first power voltage across the first detection circuit,
the second detection circuit comprises a voltage-dividing circuit including a second thermistor and a second resistor that are coupled in series and is configured to operate in response to application of a second power voltage across the second detection circuit, the second power voltage being greater than the first power voltage, and
each of the temperature detectors further includes a power switch that is configured to supply the second power voltage to the second detection circuit on a basis of the flag signal outputted from the comparator circuit.

3. The battery monitoring device according to claim 2, wherein
each of the temperature detectors further includes a first diode and a second diode,
an output node of the first detection circuit is coupled to an output node of the second detection circuit via the first diode, and
the second detection circuit is coupled to the power switch via the second diode.

4. The battery monitoring device according to claim 1, the device further comprising
a battery manager configured to control the battery, wherein
when the flag signal indicative of the presence of the abnormal event is outputted through the second output terminal, the battery manager determines whether the abnormal event corresponds to overheating of the battery or an abnormality of corresponding one of the temperature detectors on a basis of the detection output signal outputted through the first output terminal.

5. The battery monitoring device according to claim 2, the device further comprising
a battery manager configured to control the battery, wherein
when the flag signal indicative of the presence of the abnormal event is outputted through the second output terminal, the battery manager determines whether the abnormal event corresponds to overheating of the battery or an abnormality of corresponding one of the temperature detectors on a basis of the detection output signal outputted through the first output terminal.

6. The battery monitoring device according to claim 3, the device further comprising
a battery manager configured to control the battery, wherein
when the flag signal indicative of the presence of the abnormal event is outputted through the second output terminal, the battery manager determines whether the abnormal event corresponds to overheating of the battery or an abnormality of corresponding one of the temperature detectors on a basis of the detection output signal outputted through the first output terminal.

7. The battery monitoring device according to claim 4, wherein
when the flag signal indicative of the presence of the abnormal event is outputted through the second output terminal, the battery manager determines whether use of the battery is permissible on a basis of a rate of temporal change of the detection output signal outputted through the first output terminal.

8. The battery monitoring device according to claim 5, wherein
when the flag signal indicative of the presence of the abnormal event is outputted through the second output terminal, the battery manager determines whether use of the battery is permissible on a basis of a rate of temporal change of the detection output signal outputted through the first output terminal.

9. The battery monitoring device according to claim 6, wherein
when the flag signal indicative of the presence of the abnormal event is outputted through the second output terminal, the battery manager determines whether use of the battery is permissible on a basis of a rate of temporal change of the detection output signal outputted through the first output terminal.

10. An electric-vehicle control apparatus comprising:
the battery monitoring device according to claim 4; and
a vehicle controller configured to control the electric vehicle on a basis of an output from the battery monitoring device, wherein
when the battery manager determines that the abnormal event corresponds to the abnormality of the corresponding one of the temperature detectors, the vehicle controller gives an occupant a warning about the abnormality, and
when the battery manager determines that the abnormal event corresponds to the overheating of the battery, the vehicle controller gives the occupant a warning about the overheating.

11. An electric-vehicle control apparatus comprising:
the battery monitoring device according to claim 5; and
a vehicle controller configured to control the electric vehicle on a basis of an output from the battery monitoring device, wherein
when the battery manager determines that the abnormal event corresponds to the abnormality of the corresponding one of the temperature detectors, the vehicle controller gives an occupant a warning about the abnormality, and
when the battery manager determines that the abnormal event corresponds to the overheating of the battery, the vehicle controller gives the occupant a warning about the overheating.

12. An electric-vehicle control apparatus comprising:
the battery monitoring device according to claim 6; and
a vehicle controller configured to control the electric vehicle on a basis of an output from the battery monitoring device, wherein
when the battery manager determines that the abnormal event corresponds to the abnormality of the corresponding one of the temperature detectors, the vehicle controller gives an occupant a warning about the abnormality, and
when the battery manager determines that the abnormal event corresponds to the overheating of the battery, the vehicle controller gives the occupant a warning about the overheating.

13. An electric-vehicle control apparatus comprising:
the battery monitoring device according to claim 7; and a vehicle controller configured to control the electric vehicle on a basis of an output from the battery monitoring device, wherein when the battery manager determines that the abnormal event corresponds to the abnormality of the corresponding one of the temperature detectors, the vehicle controller gives an occupant a warning about the abnormality, and when the battery manager determines that the abnormal event corresponds to the overheating of the battery, the vehicle controller gives the occupant a warning about the overheating.

14. An electric-vehicle control apparatus comprising:

the battery monitoring device according to claim 8; and a vehicle controller configured to control the electric vehicle on a basis of an output from the battery monitoring device, wherein when the battery manager determines that the abnormal event corresponds to the abnormality of the corresponding one of the temperature detectors, the vehicle controller gives an occupant a warning about the abnormality, and when the battery manager determines that the abnormal event corresponds to the overheating of the battery, the vehicle controller gives the occupant a warning about the overheating.

15. An electric-vehicle control apparatus comprising:

the battery monitoring device according to claim 9; and a vehicle controller configured to control the electric vehicle on a basis of an output from the battery monitoring device, wherein when the battery manager determines that the abnormal event corresponds to the abnormality of the corresponding one of the temperature detectors, the vehicle controller gives an occupant a warning about the abnormality, and when the battery manager determines that the abnormal event corresponds to the overheating of the battery, the vehicle controller gives the occupant a warning about the overheating.

\* \* \* \* \*